US009207541B2

(12) United States Patent
Hauf et al.

(10) Patent No.: US 9,207,541 B2
(45) Date of Patent: Dec. 8, 2015

(54) ARRANGEMENT FOR MIRROR TEMPERATURE MEASUREMENT AND/OR THERMAL ACTUATION OF A MIRROR IN A MICROLITHOGRAPHIC PROJECTION EXPOSURE APPARATUS

(71) Applicant: Carl Zeiss SMT GmbH, Oberkochen (DE)

(72) Inventors: Markus Hauf, Ulm (DE); Norman Baer, Aalen (DE); Holger Walter, Abtsgmuend (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 288 days.

(21) Appl. No.: 13/784,979

(22) Filed: Mar. 5, 2013

(65) Prior Publication Data
US 2013/0176544 A1  Jul. 11, 2013

Related U.S. Application Data

(63) Continuation of application No. PCT/EP2011/066415, filed on Sep. 21, 2011.

(60) Provisional application No. 61/387,075, filed on Sep. 28, 2010.

(30) Foreign Application Priority Data

Sep. 28, 2010 (DE) .......................... 10 2010 041 500

(51) Int. Cl.
*G03F 7/20* (2006.01)
*G02B 7/18* (2006.01)
*G01J 5/02* (2006.01)

(52) U.S. Cl.
CPC ............... *G03F 7/70058* (2013.01); *G01J 5/02* (2013.01); *G02B 7/181* (2013.01); *G02B 7/1815* (2013.01); *G03F 7/70266* (2013.01); *G03F 7/70891* (2013.01)

(58) Field of Classification Search
CPC ......... G01J 5/02; G02B 7/181; G02B 7/1815; G03F 7/70058; G03F 7/70266; G03F 7/70891
See application file for complete search history.

(56) References Cited

U.S. PATENT DOCUMENTS

| 4,678,293 A | 7/1987 | Paseri |
| 6,198,579 B1 | 3/2001 | Rupp |

(Continued)

FOREIGN PATENT DOCUMENTS

| DE | 102009024118 | 2/2010 |
| DE | 10 2009 045 171 | 10/2010 |

(Continued)

OTHER PUBLICATIONS

International Preliminary Report on Patentability for PCT/EP2011/066415, dated Apr. 11, 2013.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

The disclosure concerns an arrangement for mirror temperature measurement and/or thermal actuation of a mirror in a microlithographic projection exposure apparatus. The mirror has an optical effective surface and at least one access passage extending from a surface of the mirror, that does not correspond to the optical effective surface, in the direction of the effective surface. The arrangement is designed for mirror temperature measurement and/or thermal actuation of the mirror via electromagnetic radiation which is propagated along the access passage. The electromagnetic radiation is reflected a plurality of times within the access passage.

25 Claims, 13 Drawing Sheets

(56) References Cited

U.S. PATENT DOCUMENTS

| | | |
|---|---|---|
| 7,102,727 B2 | 9/2006 | Hara |
| 7,212,274 B2 | 5/2007 | Hara et al |
| 7,236,230 B2 | 6/2007 | Miyajima |
| 7,286,637 B2 | 10/2007 | Imai et al. |
| 7,315,347 B2 | 1/2008 | Miyajima |
| 7,336,342 B2 | 2/2008 | Holderer et al. |
| 7,524,072 B2 | 4/2009 | Laufer et al. |
| 2004/0051984 A1 | 3/2004 | Oshino et al. |
| 2005/0110967 A1 | 5/2005 | Hara et al. |
| 2009/0257032 A1 | 10/2009 | Eva et al. |
| 2010/0033704 A1 | 2/2010 | Shiraishi |
| 2010/0200777 A1 | 8/2010 | Hauf |
| 2011/0249245 A1 | 10/2011 | Janssen et al. |

FOREIGN PATENT DOCUMENTS

| | | |
|---|---|---|
| EP | 1376185 | 1/2004 |
| EP | 1376192 | 1/2004 |
| EP | 1 923 730 | 5/2008 |
| JP | 08-255800 | 10/1996 |
| JP | 2004-029314 | 1/2004 |
| JP | 2004-039851 | 2/2004 |
| JP | 2004-327529 | 11/2004 |
| JP | 2004-354655 | 12/2004 |
| JP | 2005-024818 | 1/2005 |
| JP | 2005-055553 | 3/2005 |
| JP | 2005-064391 | 3/2005 |
| JP | 2005-109158 | 4/2005 |
| JP | 2005-140999 | 6/2005 |
| JP | 2005-149829 | 6/2005 |
| JP | 2010-045347 | 2/2010 |
| JP | 2011-512018 | 4/2011 |
| JP | 2011-222992 | 11/2011 |
| WO | WO 03/093903 | 11/2003 |
| WO | 2008/034636 | 3/2008 |
| WO | WO 2008/034636 | 3/2008 |
| WO | 2009/046955 | 4/2009 |
| WO | 2009/152959 | 12/2009 |
| WO | 2010/018753 | 2/2010 |
| WO | WO 2011/039093 | 4/2011 |

OTHER PUBLICATIONS

English translation and German Office Action for corresponding German patent application No. 10 2010 041 500.6, dated Jun. 8, 2011.

Mitra et al., "Optimized Glass-ceramic Substrate Materials for EUVL Applications," Proc. SPIE 5374, Emerging Lithographic Technologies VIII, 96, May 20, 2004.

International Search Report and Written Opinion issued in PCT/EP2011/066415, mailed Mar. 12, 2012.

Japanese Office Action and English translation thereof for corresponding JP Appl. No. 2013-530679, 9 pages, dated Aug. 26, 2015.

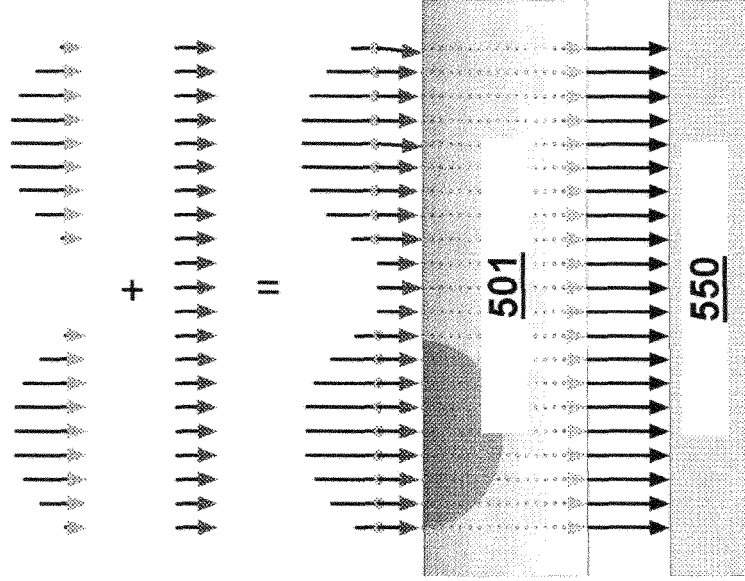
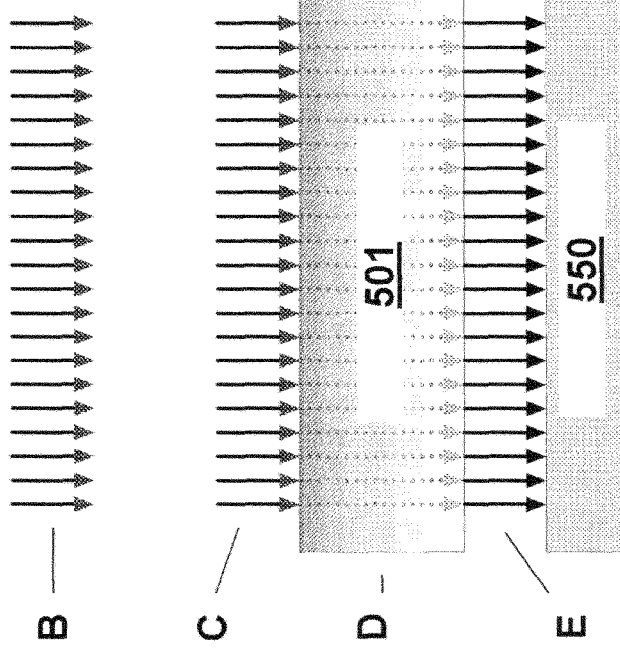

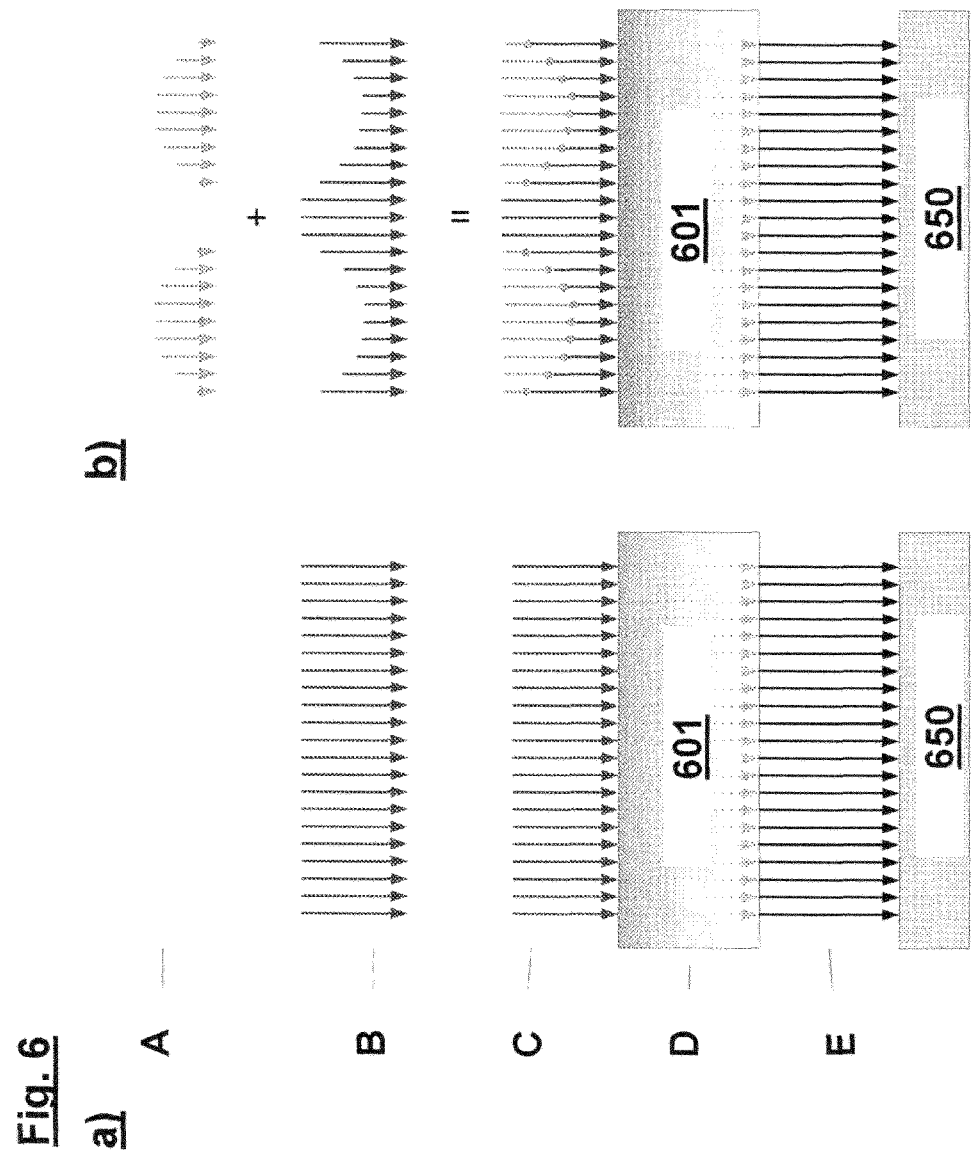

ARRANGEMENT FOR MIRROR TEMPERATURE MEASUREMENT AND/OR THERMAL ACTUATION OF A MIRROR IN A MICROLITHOGRAPHIC PROJECTION EXPOSURE APPARATUS

CROSS-REFERENCE TO RELATED APPLICATIONS

This application is a continuation of, and claims priority under 35 USC 120 to, International Application Serial Number PCT/EP2011/066415, filed Sep. 21, 2011, which claims benefit under 35 USC 119 of German Patent Application 10 2010 041 500.6, filed Sep. 28, 2010. International Application Serial Number PCT/EP2011/066415 also claims priority under 35 USC 119 to U.S. Provisional Application No. 61/387,075, filed Sep. 28, 2010. The entire contents of each of these applications are hereby incorporated by reference.

FIELD

The disclosure concerns an arrangement for mirror temperature measurement and/or thermal actuation of a mirror in a micro lithographic projection exposure apparatus.

BACKGROUND

Microlithography is used for the production of micro structured components such as for example integrated circuits or LCDs. The microlithography process is carried out in a so-called projection exposure apparatus having an illumination system and a projection objective. The image of a mask (=reticle) illuminated via the illumination system is projected via the projection objective onto a substrate (for example a silicon wafer) which is coated with a light-sensitive layer (photoresist) and arranged in the image plane of the projection objective in order to transfer the mask structure onto the light-sensitive coating on the substrate.

Mirrors are used as optical components for the imaging process in projection objectives designed for the EUV range, that is to say at wavelengths of for example about 13 nm or about 7 nm, due to the general lack of availability of suitable translucent refractive materials. A problem which arises in practice is that the EUV mirrors experience a rise in temperature and therefore a thermal expansion or deformation, as a consequence of absorption of the radiation emitted by the EUV light source. That expansion or deformation in turn can result in worsening of the imaging properties of the optical system. To assess those effects and possibly to be able to compensate for them, it is desirable to determine the extent of that rise in mirror temperature as accurately as possible and possibly control it in the sense of thermal actuation. A further problem can arise because, by virtue of using special illumination settings (such as for example dipole or quadrupole settings) in the lithography process and by virtue of the diffraction orders caused by the reticle, the heat input caused by the EUV radiation can vary over the optically effective cross-section of mirrors near the pupil, that is to say that it involves non-homogenous heat input into the mirror. In addition field variations in the reticle and/or partial masking off of the full field can result in non-homogenous light intensities on mirrors near the field.

Approaches for mirror temperature measurement and/or actuation of a mirror or targeted deformation thereof are known, for example, from WO 2010/018753 A1, US 2004/0051984 A1, WO 2008/034636 A2, DE 10 2009 024 118 A1 and WO 2009/046955 A2.

SUMMARY

The disclosure provides an arrangement for mirror temperature measurement and/or for thermal actuation of a mirror in a microlithographic projection exposure apparatus, which permits rapid and reliable mirror temperature measurement or thermal actuation without adversely affecting the lithography process.

In one aspect, the disclosure provides an arrangement for mirror temperature measurement and/or thermal actuation of a mirror in a microlithographic projection exposure apparatus the mirror has an optical effective surface and at least one access passage extending from a surface of the mirror, that does not correspond to the optical effective surface, in the direction of the effective surface. The arrangement is designed for mirror temperature measurement and/or thermal actuation of the mirror via electromagnetic radiation which is propagated along the access passage. The electromagnetic radiation is reflected a plurality of times within the access passage.

The disclosure is therefore based on the concept of implementing a mirror temperature measurement and/or thermal actuation of a mirror in a micro lithographic projection exposure apparatus by way of an access passage which extends from a surface other than the optical effective surface of the mirror into the mirror substrate. By virtue of that access passage the electromagnetic radiation serving for mirror temperature measurement and/or thermal actuation can be "read off" (in the case of mirror temperature measurement) or (in the case of thermal actuation) passed into the mirror substrate material, without adversely affecting the optical effective surface of the mirror but in the immediate proximity with that optical effective surface.

The disclosure makes use in particular of the fact that the electromagnetic radiation reflected within the access passage, with sufficiently shallow reflection angles, that is to say in situations involving what is referred to as "grazing incidence", is determined only with respect to a very slight or negligible proportion by the emissivity or absorption of the wall or surface causing the reflection within the access passage. Rather, with such grazing incidence within the access passage the situation involves substantially a (forwards) transport of the electromagnetic radiation along the access passage so that the respective reflecting wall of the access passage itself only has a slight or negligible radiation contribution.

Consequently, in the case of mirror temperature measurement the electromagnetic radiation can be transported from the location at which the radiation is read off or from a region in the immediate proximity of the optical effective surface of the mirror by way of the access passage to a sensor disposed outside the mirror substrate in order to obtain information about the temperature state of the optical effective surface of the mirror by way of measurement and evaluation which is effected outside the mirror substrate, and optionally to provide for effective regulation of the mirror temperature.

Conversely, in the case of thermal actuation, it is possible to provide for specifically targeted and controlled coupling of electromagnetic radiation by way of the access passage into a region in the immediate proximity of the optical effective surface, in which case that specifically targeted and controlled introduction of electromagnetic radiation can be combined with permanent heat dissipation by way of suitable cooling, in particular—as described in greater detail hereinafter—in a manner which is advantageous in terms of regulating procedures.

In an advantageous configuration the reflection angle of the electromagnetic radiation within the access passage is not greater than 20°, preferably not greater than 15°, whereby the above-described "grazing incidence" is afforded.

In that respect the reflection angle is interpreted here and hereinafter as the angle of the incident and reflected beam relative to the reflecting surface.

To ensure that all electromagnetic radiation contributing to mirror temperature measurement or thermal actuation fulfills the foregoing angle condition, it is possible to use a suitable angle-discriminating optical system in order to suitably limit the angle range—for example at the location of a sensor used for mirror temperature measurement.

In an embodiment the electromagnetic radiation in question is of a wavelength for which the mirror is at least regionwise opaque. In particular the electromagnetic radiation is preferably of a wavelength of at least 2.5 µm, further particularly a wavelength of at least 5 µm, as can be implemented for example by way of a so-called low-temperature radiating mechanism at temperatures of up to 400° C., in particular in the range of up to 200° C.

That wavelength range corresponds at the same time to the relevant wavelength range of the main radiation component of typical mirror materials used in EUV lithography such as glass materials which an extremely low coefficient of expansion or (almost) zero expansion (="ultra low" or "zero expansion" glass). Such a mirror substrate material is for example the glass ceramic which is marketed by SCHOTT Glass under the trade mark name Zerodur®. A further material which can be used is for example silicon carbide.

In the aforementioned wavelength range of at least 5 µm that at the same time guarantees that the wavelengths are outside the transmission window of the mirror substrate materials in question (which typically includes wavelengths below 4 µm). That accordingly prevents electromagnetic radiation from the exterior or from the optical system, in the form of background radiation, from passing through the mirror substrate material into the access passage and adversely affecting mirror temperature measurement or thermal actuation. Furthermore, with the wavelength range above 5 µm, it is precisely that range in which a thermopile sensor—which according to the disclosure can be used to particular advantage—responds or has maximum sensitivity, that is advantageously employed.

That situation is diagrammatically shown in FIG. 2, wherein the transmission window of the "zero expansion glass" in question is identified by "I" and the sensitivity window of a thermopile sensor is identified by "II", and wherein the curves shown in the drawing respectively give the spectral radiation density (in watt/($m*m^2*sr$)) for black body radiation at temperatures of between 20° C. and 200° C. (in steps of 20° C.).

In an embodiment the access passage is separated from the optical effective surface by a remaining mirror material portion, the thickness of which is in the range of between 5 and 20 mm. In that way for example in the case of mirror temperature measurement it is possible to implement a response time (corresponding to the delay between heat input and a corresponding reaction from the sensor) which is sufficiently short for good regulating performance. On the other hand (due to the spacing which is not too low and which preferably is not below 5 mm) it is possible to achieve a desired averaging effect with respect to existing local variations in the thermal load at the optical effective surface, with which corresponding unwanted fluctuations are averaged out.

In an embodiment the access passage extends from the surface of the mirror, that is opposite to the optical effective surface, in the direction of the optical effective surface. The disclosure however is not limited thereto so that in further embodiments the access passage can also extend from another surface of the mirror, that does not correspond to the optical effective surface, into the mirror (for example if that is appropriate by virtue of the mirror position in the optical system, for reasons of structural space).

The disclosure can equally be used in the illumination system or in the projection objective of a microlithographic projection exposure apparatus, in particular in a microlithographic projection exposure apparatus designed for EUV.

In an embodiment the arrangement further has a regulating device, by way of which the mirror can be heated to a constant temperature or a temporally variable presetting temperature in dependence on the mirror temperature measurement.

That temperature can be in particular in the range of between 22° C. and 45° C., further particularly in the range of between 25° C. and 40° C. Furthermore that temperature can correspond to the so-called zero crossing temperature at which there is no or only a negligible thermal expansion of the mirror substrate material so that heat inputs into the mirror substrate material which occur in the lithography process and which are possibly non-homogenous do not lead to deformation or optical aberration phenomena or the aberration phenomena can still be corrected with an existing correcting mechanism.

In an embodiment the arrangement has a plurality of access passages of the above-described kind, whereby, as is described in greater detail hereinafter, it is possible to provide for positionally resolved mirror temperature measurement and/or thermal actuation.

In an embodiment the arrangement further has at least one heat radiating mechanism which produces the electromagnetic radiation which is propagated within the access passage (in particular reflected a plurality of times).

In an embodiment the arrangement can further have a manipulator for varying the advance position of the heat radiating mechanism along the access passage. In that way the heated zone at the mirror (in particular in the region of the optical effective surface of the mirror) and therewith a (counter)-deformation finally achieved by the thermal actuation according to the disclosure can be varied so that a further degree of freedom with respect to thermal actuation of the mirror in relation thereto is achieved.

The heat radiating mechanism can be in the form of a heating bar of a preferably substantially needle-shaped geometry, which is advantageous in particular in regard to the comparatively small structural space involved.

In an embodiment the arrangement has at least two access passages of differing geometry.

In an embodiment at least one access passage can have a geometry differing from a cylindrical geometry. Such a geometry can, e.g., be a conical geometry. The disclosure however is not limited thereto, so other geometries, such as for example a step-wise variation of the diameter of the respective access passage, are also possible. Such geometries can be advantageous if for example a desired effect in a given (edge) region of a mirrors, e.g., of a facet mirror, can be better achieved when using, e.g., a conical access passage than when using an access passage of cylindrical geometry.

In an embodiment the at least one heat radiating mechanism is also laterally actuable with respect to the direction of the access passage.

The heat radiating mechanism can be connected to a regulatable heating device. The temperature set by such a regulatable heating device for heating the mirror substrate, alternatively or additionally to the advance position of the heat radiating mechanism, forms a further parameter for variation in the thermal actuation of the mirror.

The heat radiating mechanism can involve a low-temperature radiating mechanism (involving a temperature in the range of up to 400° C.) or a high-temperature radiating mechanism (involving a temperature above 400° C.). In addition it is also possible to use monochromatic light sources (for example in the form of lasers or LEDs) as a heat radiating mechanism.

In an embodiment the arrangement has a plurality of such heat radiating mechanisms which are arranged as an array and are selectively actuable.

In an embodiment the arrangement further has a cooler for dissipating heat to the environment. That cooler can be in particular at a constant temperature. By combining the constant heat dissipation flow caused by such a cooler with a heat input which is selectively controllable by way of the arrangement of low-temperature radiating mechanism, it is possible to provide an arrangement which is particularly efficient in terms of regulating procedures and which permits in particular a fast reaction to non-homogenous heat inputs in the mirror by specifically targeted variation in the heat radiation emitted by the low-temperature radiating mechanism.

The disclosure further concerns a method of mirror temperature measurement and/or thermal actuation of a mirror in a micro lithographic projection exposure apparatus. For preferred configurations or advantages of the method attention is directed to the foregoing information in relation to the arrangement according to the disclosure.

In an embodiment the electromagnetic radiation is produced by way of an arrangement of selectively actuable heat radiating mechanisms. Here too the heat radiating mechanisms can be low-temperature radiating mechanisms (involving a temperature in a range of up to 400° C.) or high-temperature radiating mechanisms (involving a temperature above 400° C.). It is also possible to use monochromatic light sources (for example in the form of lasers or LEDs) as heat radiating mechanisms.

According to further aspects, the disclosure also relates to an arrangement for thermal actuation of a mirror in a microlithographic projection exposure apparatus, wherein the mirror has an optical effective surface and at least one access passage extending from a surface of the mirror, that does not correspond to the optical effective surface, in the direction of the effective surface, wherein the arrangement is designed for thermal actuation of the mirror via electromagnetic radiation which is propagated in the access passage, wherein the arrangement further has at least one heat radiating mechanism which produces the electromagnetic radiation which is propagated in the access passage, and wherein the heat radiating mechanism is actuable along the access passage.

In an embodiment, the arrangement has a manipulator for varying the advance position of the heat radiating mechanism along the access passage.

In an embodiment, the heat radiating mechanism is in the form of a heating bar with a preferably substantially needle-shaped geometry.

In an embodiment, the mirror has a plurality of such access passages.

In an embodiment, the arrangement has a plurality of such heat radiating mechanisms which are arranged as an array.

In an embodiment, the heat radiating mechanisms are selectively actuable.

In an embodiment, the mirror is composed of a multiplicity of mirror facets.

In an embodiment, each one of the mirror facets has at least one access passage with a heat radiating mechanism being actuable along the access passage.

In an embodiment, the mirror has at least two access passages of differing geometry.

In an embodiment at least one access passage has a geometry differing from a cylindrical geometry, in particular a conical geometry or a step-wise variation of the diameter along the respective access passage.

In an embodiment the at least one heat radiating mechanism is also laterally actuable with respect to the direction of the access passage.

In an embodiment the at least one heat radiating mechanism is connected to a regulatable heating device.

In an embodiment the arrangement further has a cooler for dissipating heat to the environment.

According to further aspects, the disclosure also relates to a method of thermal actuation of a mirror in a microlithographic projection exposure apparatus, wherein the mirror has an optical effective surface and at least one access passage extending from a surface of the mirror, that does not correspond to the optical effective surface, in the direction of the optical effective surface, and wherein the thermal actuation of the mirror is effected by electromagnetic radiation which is propagated in the access passage, wherein the heat radiating mechanism is actuable along the access passage. The wording according to which "the heat radiating mechanism is actuable along the access passage" also includes embodiments in which the position of the heat radiating mechanism is variable only along a portion of the access passage (e.g., by varying the advance position of the heat radiating mechanism along a partial length of the access passage).

In an embodiment a counter-deformation achieved via the thermal actuation of the mirror at least partially compensates a thermal surface deformation of the mirror due to absorption of radiation emitted by a light source in operation of the microlithographic projection exposure apparatus.

In an embodiment the electromagnetic radiation is produced by way of an arrangement of selectively actuated heat radiating mechanism.

In an embodiment the heat radiating mechanisms are thermally actuated different from each other along a cross-section of the mirror.

In an embodiment the mirror is composed of a multiplicity of mirror facets.

In an embodiment at least two, in particular all of the mirror facets are thermally actuated different from each other via the heat radiating mechanism.

Further configurations of the disclosure are to be found in the description and the appendant claims.

BRIEF DESCRIPTION OF THE DRAWINGS

The disclosure is described in greater detail hereinafter via embodiments by way of example illustrated in the accompanying drawings, in which:

FIGS. 5-6 show diagrammatic views of different concepts for thermal actuation of a mirror.

DETAILED DESCRIPTION OF THE PREFERRED EMBODIMENTS

Hereinafter reference will firstly be made to FIG. 1 to describe an arrangement according to the disclosure for mirror temperature measurement in a first embodiment.

Figure 1:
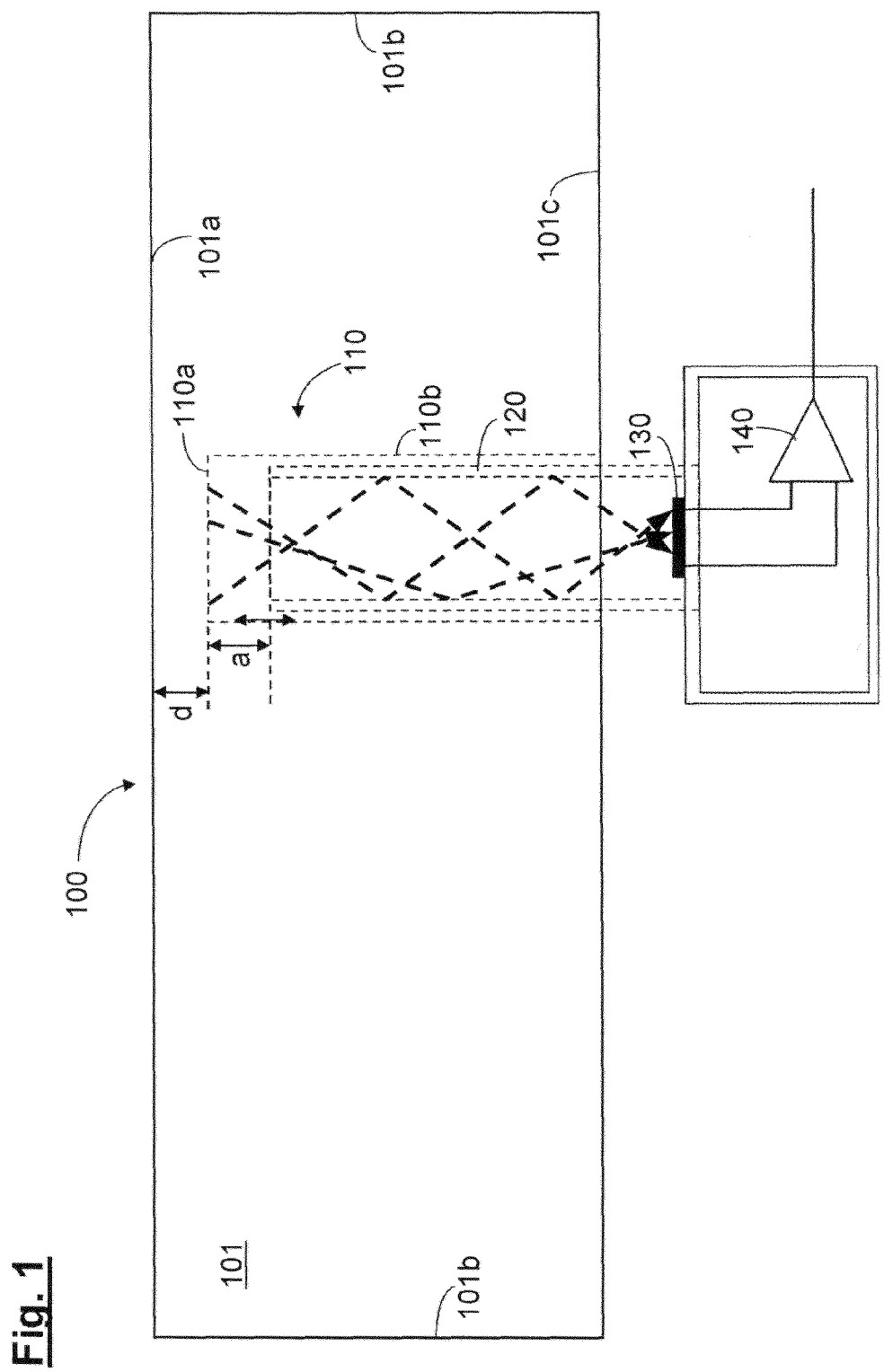
FIG. 1 shows a diagrammatic view of an arrangement according to the disclosure for mirror temperature measurement in a first embodiment of the disclosure.
Figure 2:
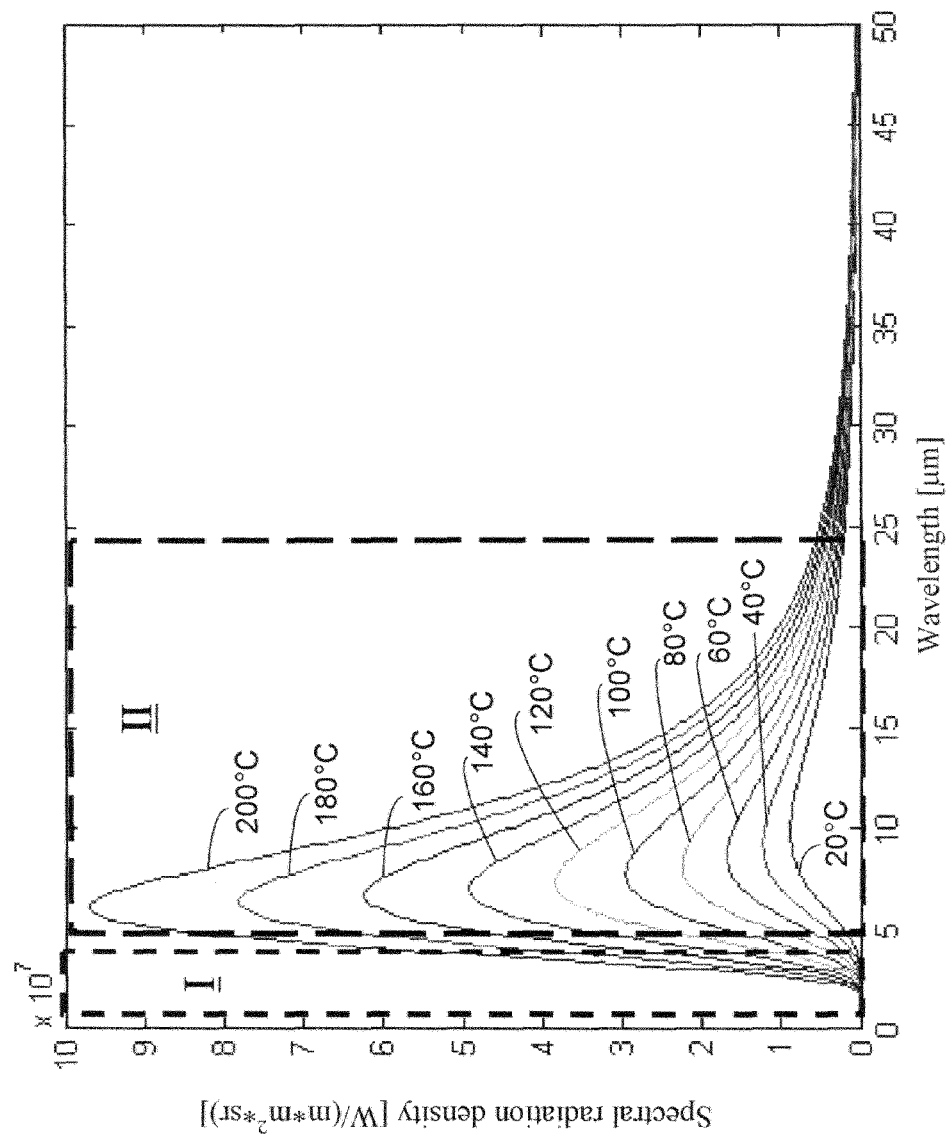
FIG. 2 shows a graph representing the wavelength dependency of the spectral radiation density (in watt/(m*m$^2$*sr)) for different temperatures together with the transmission window of a typical mirror substrate material and the sensitivity window of a typical thermopile sensor.

FIG. 1 diagrammatically shows a mirror 101 whose optical effective surface is identified by reference 101a, wherein the side surface of the mirror substrate is identified by reference 101b and the surface remote from the optically effective surface 101a, or rear side of the mirror, is identified by reference 101c. Extending into the mirror substrate of the mirror 101 is an access passage 110 which for example is in the form of a bore and whose end face, that is towards the optically effective surface 101a of the mirror 101 is identified by reference 110a and whose side surface or wall is identified by reference 110b. Disposed on the optically effective surface 101a of the mirror 101 is a reflective coating (not shown in FIG. 1).

FIG. 1 like also the other Figures represents a diagrammatic view which is not true to scale, wherein purely exemplary dimensions of the access passage 110 (without the disclosure being restricted thereto) can include a diameter for the bore in the range of between 5 and 20 mm and a spacing, identified "d", of the end face 110a from the optical effective surface 101a in the range of also between 5 and 20 mm. Typical thicknesses of the mirror 101 itself can be (also only by way of example and without restriction on the disclosure) for example in the range of between about 50 mm and 120 mm.

The arrangement shown in FIG. 1 further includes a tube 120 which projects from the region outside the mirror 101 into the access passage 110. The spacing identified by "a" of the end portion of the tube 120 from the end face 110a of the access passage 110 (also without the disclosure being restricted thereto) can be for example at least 3 mm (in the case of an actuated mirror) or at least 0.5 mm (in the case of a non-actuated or stationary mirror). Corresponding values by way of example of at least 3 mm in the case of an actuated mirror or at least 0.5 mm in the case of a non-actuated or stationary mirror can apply to the spacing of the wall of the tube 120 from the side wall 110b of the access passage 110.

The arrangement 100 in FIG. 1 further includes a sensor 130 arranged at the end portion of the tube 120, outside the mirror 101, and in the form of a thermopile sensor in the illustrated embodiment. Such a thermopile sensor in known manner includes a receiver membrane in the form of a blackened surface which is to be irradiated, as well as a chain of thermocouple elements for amplifying the electrical voltage obtained by conversion of the measured temperature difference. A typical voltage swing involved in that case can be for example 40 µV/K and can be further amplified by a pre-amplifier 140.

As shown by the broken lines in FIG. 1, in the case of a thermal loading on the optical effective surface 101a of the mirror 101 the heat radiation which is read off in the immediate proximity of the optical effective surface 101a, more specifically at the end face 110a of the access passage 110, passes by multiple grazing-incidence reflection at the wall of the tube 120 to the sensor 130 where the temperature change caused by the aforementioned loading is ascertained.

To ensure that only that electromagnetic radiation which has been reflected at the wall of the tube 120 in a condition of grazing incidence is evaluated the sensor 130 can have an angle-discriminating optical system in per se known manner. In addition, to ensure that only electromagnetic radiation in the above-described wavelength range above 5 µm is evaluated it is possible to use a suitable filter which for example completely blocks out wavelengths below 5 µm (at which the mirror material such as for example the above-mentioned glass materials with a thermal expansion of almost zero still behaves as transparent).

In further embodiments the structure shown in FIG. 1 can be used not only for monitoring the mirror temperature but also (using a suitable regulating device) for active regulation of the mirror temperature. In that case in particular the mirror 101 can be kept from the outset at a temperature at which any temperature gradients at the mirror surface (for example as a consequence of non-homogenous heat loads as can be caused by special illumination settings) are not reproduced in terms of deformation of the mirror substrate material. In that respect it is possible to make use of the fact that the coefficient of thermal expansion (in units of m/(m*K)), in its temperature dependency, has a zero crossing, in the area around which no or only negligible thermal expansion of the mirror substrate material occurs.

That temperature is also referred to as the zero crossing temperature. The zero crossing temperature can be set by the material manufacturer according to the desired properties of the thermal design, typical values being between 22° C. and 40° C. That aspect will be discussed in greater detail hereinafter in connection with thermal actuation according to the disclosure and with reference to FIG. 5 ff.

Figure 3:
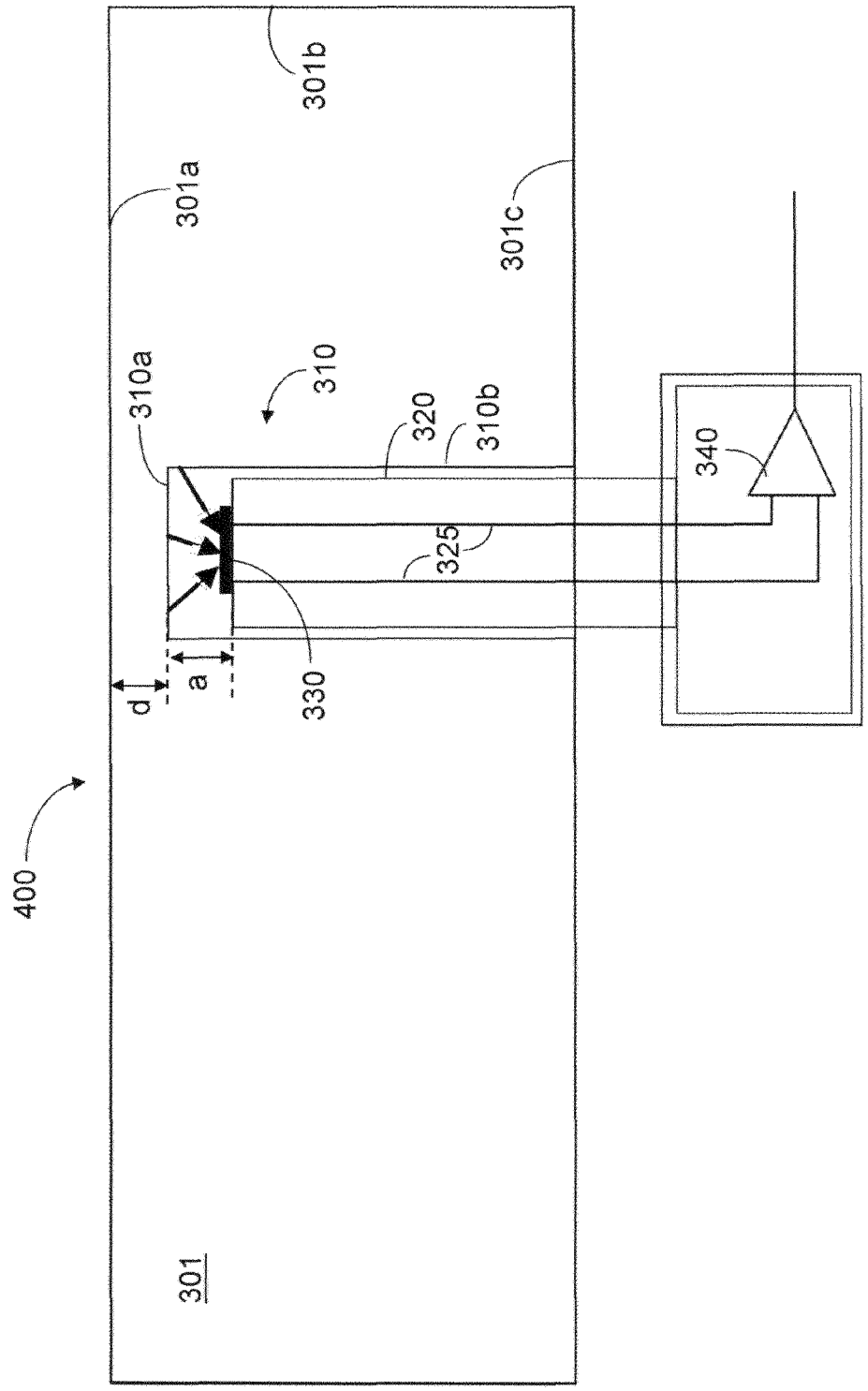
FIGS. 3-4 show diagrammatic views and arrangements for mirror temperature measurement in further embodiments of the disclosure.

As a further embodiment for mirror temperature measurement FIG. 3 shows a structure which is basically similar to FIG. 1, wherein components which correspond to each other or which involve substantially the same function are denoted in comparison with FIG. 1 by references increased by "200". The arrangement in FIG. 3 differs from that in FIG. 1 in that the sensor 330 is not placed outside the mirror 301 but in the immediate proximity of the end face 310a of the access passage 310. For that purpose, instead of the tube 120 in FIG. 1, it is possible to provide a similar component 320 which however is provided with an end carrier or roof portion 320a, on which the sensor 310 is disposed. That structure has the advantage over the FIG. 1 structure that conversion of the electromagnetic radiation read off at the location of the end face 310a of the access passage 310 into electrical voltage is already effected in the immediate proximity of that end face 310a so that only the electrical voltage still has to be transported through the access passage 310. As shown in FIG. 3 suitable electric lines 325 are passed for that purpose to the pre-amplifier 340.

Figure 4:
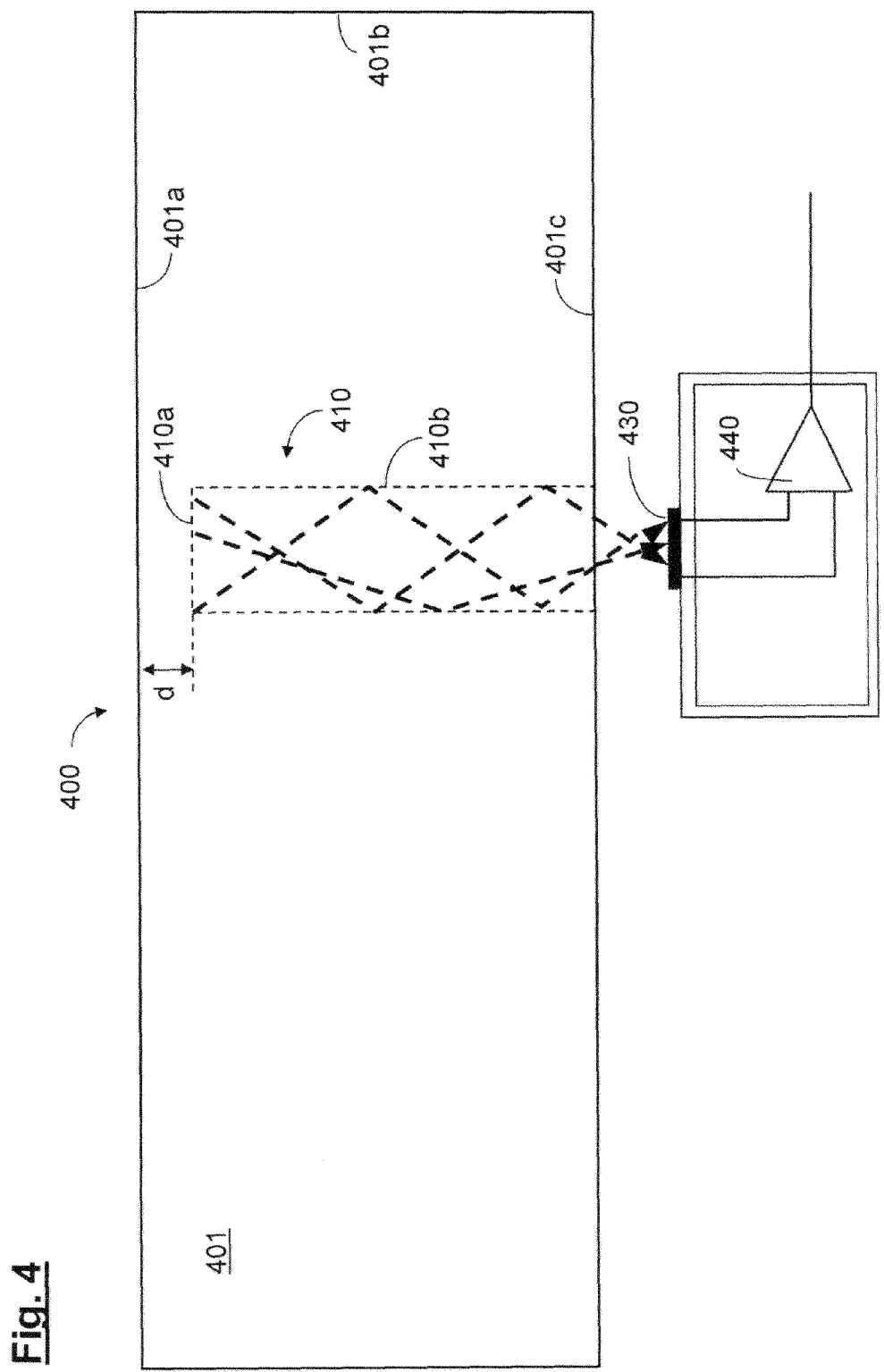

FIG. 4 shows a further embodiment of an arrangement according to the disclosure for mirror temperature measurement, wherein in comparison with the FIG. 1 arrangement components which are similar or involve substantially the same function are identified by references increased by "300".

The arrangement 400 in FIG. 4 differs from the arrangement 100 in FIG. 1 in that, dispensing with a tube within the access passage 410, its wall 410b itself is made sufficiently reflective by polishing or the like so that the mirror substrate of the mirror 401 performs the function of a light waveguide that was implemented by the tube 120 in FIG. 1, by virtue of the reflective configuration of that wall 410b itself. In regard to the appropriate spacings, dimensions and reflection angle reference is directed to the above-described embodiments. In the arrangement in FIG. 4, similarly to the above-described embodiments, use is made of the fact that, with respect to the electromagnetic radiation incident at the sensor 430, the emission component from the wall 410b of the access passage 410 is negligible in comparison with the radiation component which is transported "forwardly" along the access passage 410 and transported from the location of the radiation reading operation at the end face 410a of the access passage 410 so that it is not for example an average temperature over the entire bore that is measured, but in this case also substantially the temperature at the end face 410a, that is to say in the immediate proximity of the optical effective surface of the mirror 410. A background component which possibly remains, by virtue of a radiation emission from the wall of the bore of the access passage 410, can be eliminated in this case as in the above-described embodiments by way of suitable correction models.

The aspect according to the disclosure of actuation of a mirror in a micro lithographic projection exposure apparatus is discussed hereinafter. Firstly in that respect different concepts regarding thermal actuation will be described with reference to FIGS. 5 and 6.

The diagrammatic views in FIG. 5 show the respective heat flows or inputs into the mirror element 501 indicated by arrows for the non-operative condition (FIG. 5a) and the condition during wafer exposure (FIG. 5b), wherein A denotes the heat input due to absorbed EUV light (which disappears for the non-operative condition of the projection exposure apparatus), B denotes heating power introduced (for example using a regulator, employing the mirror temperature measurement of FIGS. 1-4), C denotes the resulting overall heat input at the optical effective surface of the mirror 501, D denotes the heat flow within the mirror element 501 and E denotes the heat dissipation flow from the mirror element 501 to a cooler 550.

It will be seen from FIG. 5b that a non-homogenous thermal loading on the mirror 501 (for example involved with specific illumination settings) admittedly leads to local temperature non-homogeneities or gradients within the mirror element 501, but in that respect those temperature non-homogeneities, as already explained hereinbefore, do not have any significant effects on mirror deformation phenomena or optical properties of the arrangement as long as thermal regulation is effected using the heating power B to a suitable temperature in the region of the zero crossing temperature.

If however the temperature gradient which is set in the mirror 501 as described departs from the range that is still acceptable around the zero crossing temperature, deformation of the mirror 501 and optical aberration phenomena can be the result. To compensate for that, as shown in FIG. 6b a heat input profile B which is complimentary to the non-homogenous heat input by virtue of the absorbed EUV light A is generated via a two-dimensional heating device, with the consequence that the total resulting condition C again corresponds to a homogenous heat input (without temperature gradients in the mirror 601). For that purpose, unlike FIG. 5, a thermal actuator which is actuable in two-dimensionally variable fashion or in positionally resolved manner is used, as is described hereinafter with reference to FIG. 7.

Different embodiments of an arrangement according to the disclosure for thermal actuation of a mirror are described hereinafter with reference to FIGS. 7 and 8.

Figure 7:
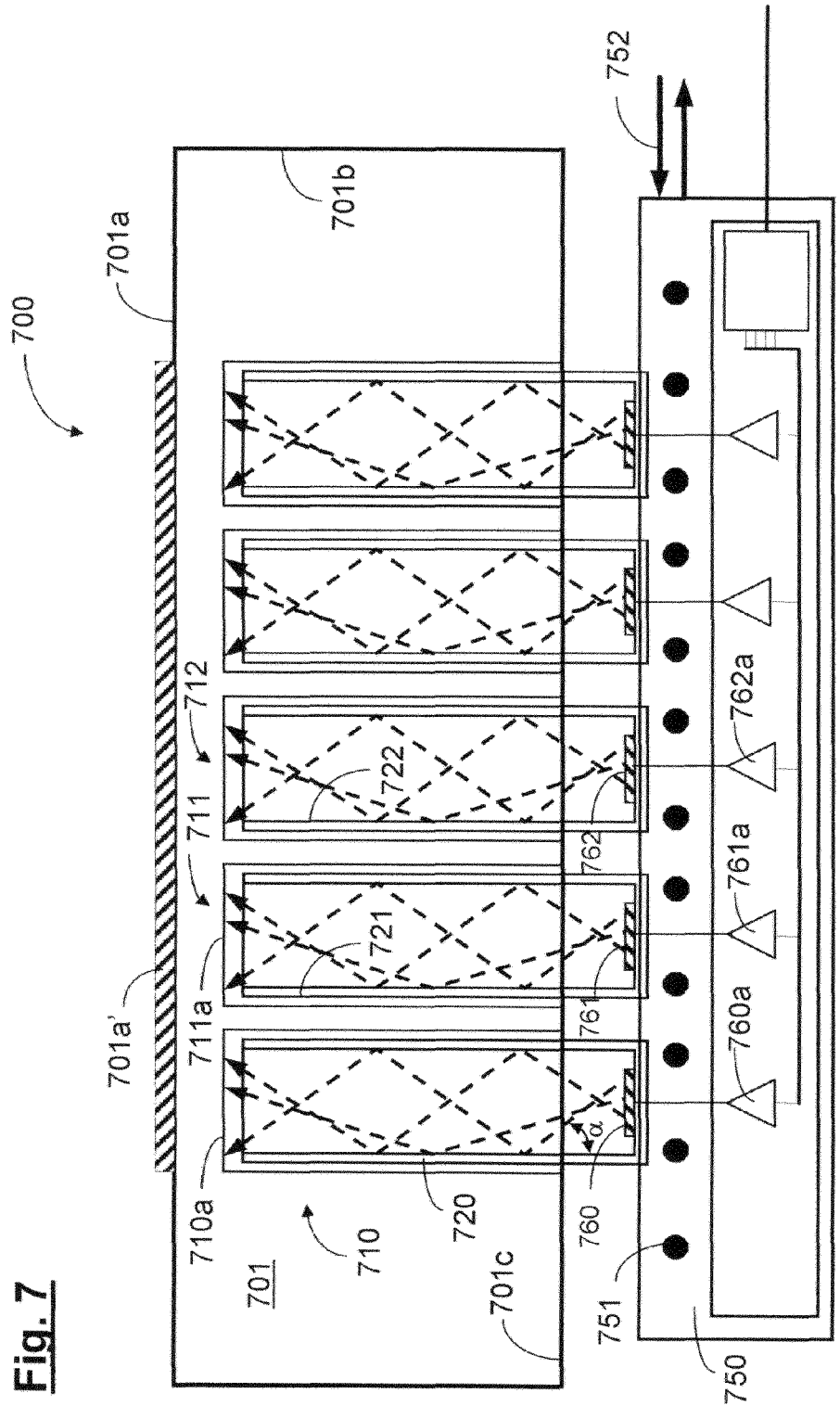
FIGS. 7-13 show diagrammatic views of arrangements for thermal actuation of a mirror in accordance with different embodiments of the disclosure.

FIG. 7 firstly shows a diagrammatic view of a mirror 700 having a plurality of access passages 710, 711, 712, ... which, similarly to the access passage 110 and 310 in FIG. 1 and FIG. 3 respectively extend from the rear side of the mirror in the direction towards the optical effective surface 701a of the mirror 701. The reflective layer in the region of the optical effective surface 701a of the mirror is hatched in FIG. 7 (and FIG. 8) and is shown only diagrammatically and on an exaggerated scale.

Also in a fashion corresponding to the embodiments of FIGS. 1 and 3, extending into the access passages 710, 711, 712, ... are respective tubes 720, 721, 722, .... In regard to suitable dimensions or spacings by way of example of the access passages 710, 711, 712, ... from the optical effective surface 701a of the mirror 701 reference is made to the description relating to FIGS. 1 and 3 respectively.

Unlike the embodiments of FIG. 1 ff intended for mirror temperature measurement, as shown in FIG. 7 no sensor is arranged at the end portion of the access passages 710, 711, 712, ... outside the mirror 701, but in each case there is a low-temperature radiating mechanism 760, 761, 762, ... which produces a heat radiation with a maximum in radiation density in the range of between 5 and 10 µm as a black body radiating mechanism involving a temperature in the range of up to 400° C., typically in the range of between 100° C. and 200° C. In further embodiments, instead of the low-temperature radiating mechanism, it is also possible to use a high-temperature radiating mechanism (involving a temperature above 400° C.) or also monochromatic light sources (for example in the form of lasers or LEDs) as a heat radiating mechanism.

The heat radiation produced by the low-temperature radiating mechanisms 760, 761, 762, ... passes through the respective access passages 710, 711, 712, ... (similarly to FIGS. 1, 3 and 4 but now in the reverse direction) and goes to the end face 710a, 711a, 712a, ... towards the optical effective surface 701a, of the respective access passage 710, 711, 712, ..., wherein as in the above-described embodiments it is reflected at the respective wall of the access passage 710, 711, 712, ..., in grazing incidence with a low reflection angle (preferably not greater than 20°, further preferably not greater than 15°). In that respect the reflection angle is interpreted here and hereinafter as the angle of the incident and reflected beam relative to the reflecting surface (identified by 'α' in FIG. 7).

In this case on the one hand the grazing incidence provides that the predominant proportion of the heat radiation reaches the aforementioned end face 710a, 711a, 712a, ... of the respective access passage 710, 711, 712, ... while an absorption proportion at the wall of the respective access passage 710, 711, 712, ... is negligibly slight. On the other hand once again the wavelength of the heat radiation is advantageously in the range in which the mirror substrate material, for example the above-mentioned glass materials with a thermal expansion of (almost) zero, is practically opaque, so that the heat radiation can be effectively coupled in to the mirror substrate material in the immediate proximity of the optical effective surface 701a.

As can also be seen from FIG. 7 a respective separate actuating mechanisms 760a, 761a, ... is associated with each low-temperature radiating mechanism 760, 761, ... so that the entire arrangement of low-temperature radiating mechanisms 760, 761, ... (which is constructed in the form of an array in matrix shape) is selectively actuable, in order to provide a two-dimensional positionally resolved heat input into the mirror 700 similarly to FIG. 6 (but from the rear side of the mirror) and in that way to take account of the above-described local non-homogeneities (caused for example by given illumination settings) of the temperature distribution on the mirror 701.

In addition a component part of the arrangement 700 in FIG. 7 is a cooler 750 having a plurality of cooling passages 751 which each have a respective cooling medium 752 flowing therethrough. The cooler 750 serves for permanent dissipation of heat to the environment and is at a constant temperature (in which respect temperature values by way of example, without the disclosure being restricted thereto, can be in the range of 22° C. down to typical cryogenic temperatures such as for example 77 Kelvin (when using for example liquid nitrogen)). In that way, that is to say as a result of the combination of the cooler 750 providing a constant heat discharge flow with a controllable heat input by way of the arrangement of low-temperature radiating mechanisms 760, 761, . . . , an arrangement which is particularly efficient in terms of regulating procedures is embodied, which in particular permits a reaction which is fast in terms of regulating procedure to non-homogenous heat inputs in the mirror 701 by a corresponding variation in the heat or infrared radiation emitted by the low-temperature radiating mechanisms 760, 761, . . . .

As in the above-described embodiments the arrangement of FIG. 7 also avoids mechanical contact of the components used with the mirror 701. In addition, disturbance of the mirror surroundings is avoided by virtue of the fact that thermal actuation is effected only within the arrangement 700 or only the cooler 750 (which is constant in its temperature) is perceived from the exterior, in which respect in particular no stray light passes into the system.

The components in the arrangement in FIG. 7, namely the cooler 750 on the one hand and the arrangement including the low-temperature radiating mechanisms 760, 761, . . . on the other hand can be operated simultaneously on the one hand. The cooler 750 and the arrangement including low-temperature radiating mechanisms 760, 761, . . . can however also be operated independently of each other, or switched off. In other words, it is also possible to implement exclusively heating or a feed of heat radiation to the end faces 711a, . . . of the access passages without simultaneously cooling, or it is possible to implement only dissipation of heat radiation from the end faces 711a, . . . of the access passages to an external cooler or a reservoir, as is described in greater detail hereinafter with reference to FIG. 9 ff.

By virtue of the described properties of thermal neutrality relative to the exterior and also the avoidance of disturbing the optical effective surface 701a of the mirror 701, the structure shown in FIG. 7 is suitable for being coupled so-to-speak as a module to a (interferometric) measurement structure which is typically used during manufacture (="metrology tool") so that measurement of the mirror 701 which is effected by such a structure during manufacture can already be implemented in the thermal condition in which the mirror 701 is also operated in the subsequent actual lithographic process. In that respect it is also possible to already implement corresponding temperature gradients which occur in the subsequent lithography process in the mirror 701 (for example by virtue of given illumination settings) in order to avoid corresponding transfer errors in making the transition from manufacture to operation.

Although described hereinbefore in relation to thermal actuation, the concept, illustrated with reference to FIG. 7, of a plurality of access passages 710, 711, 712, . . . can also be used in the mirror temperature measurement described with reference to FIGS. 1, 3 and 4 so that this can also be implemented in positionally resolved relationship (for example with a two-dimensional array of access passages with respectively associated sensors).

In further embodiments, a heating principle similar to FIG. 3 can also be used in a modification to FIG. 7, wherein low-temperature radiating mechanisms 760, 761, . . . are placed in the immediate proximity of the end faces 710a, 711a, 712a, . . . of the respective access passages 710, 711, 712, . . . .

Figure 8:
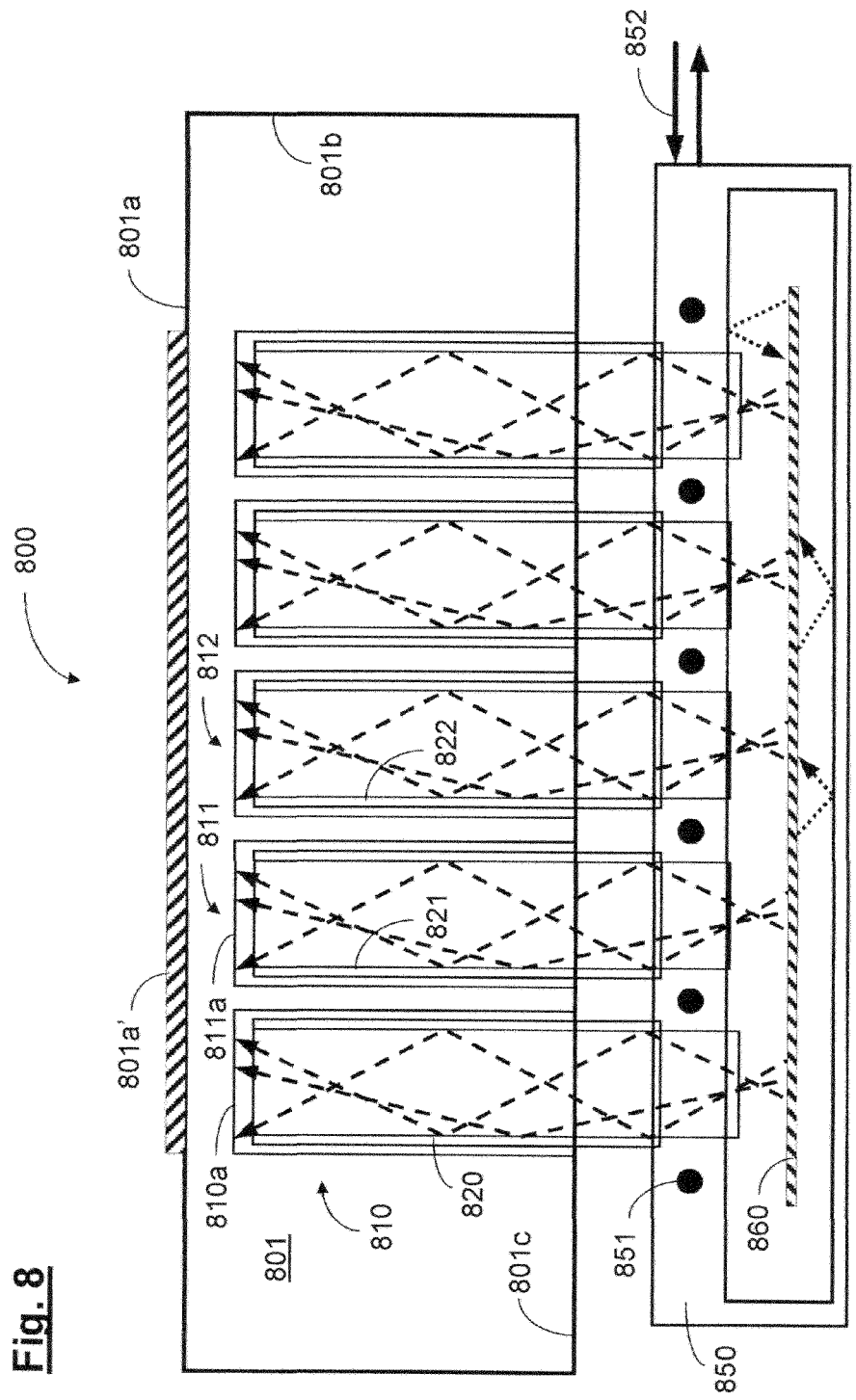

FIG. 8 shows a further embodiment, wherein, in comparison with FIG. 7, corresponding elements or elements involving substantially the same function are identified by references increased by "100". The arrangement 800 differs from the arrangement 700 in FIG. 7 in that, instead of the plurality of low-temperature radiating mechanisms 760, 761, . . . there is only a single low-temperature radiating mechanism 860 which however is of a correspondingly large surface area and which represents a thermally actuable or heatable plate (once again in the form of black body), whose emitted heat radiation passes into the access passages 810, 811, . . . distributed by way of the mirror 801 on the rear side 801c thereof and—in this respect similarly to FIG. 7—passes after grazing incidence reflection at the walls of the tubes 820, 821, . . . to the respective edge portions 810a, 811a, . . . of the access passages 810, 811, and is thus coupled into the mirror substrate material in the immediate proximity of the optical effective surface 801a of the mirror 801. Here too, in further embodiments, instead of the low-temperature radiating mechanism 860, it is also possible to use a high-temperature radiating mechanism (involving a temperature above 400° C.) or also a monochromatic light source (for example in the form of lasers or LEDs) as the heat radiating mechanism.

Figure 9:
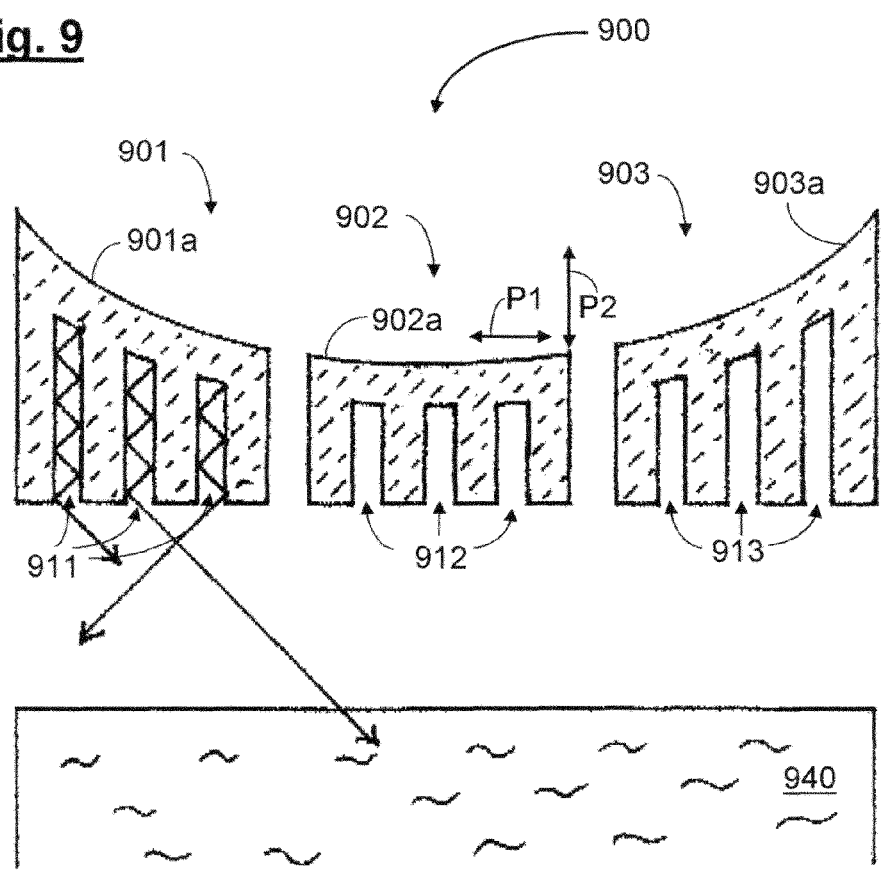

In a further aspect the access passages which are present in accordance with the disclosure within the mirror can be used to implement passive cooling of the optical effective surface of the mirror by way of directed emission of heat radiation. FIG. 9 serves to illustrate that principle, which in turn shows a mirror 900 which in the illustrated embodiment is in the form of a facet mirror composed of a plurality of mirror facets 910, 902, 903, wherein there are provided access passages 911, 912, 913 (in the embodiment, in each of the mirror facets). In that arrangement the mirror can be of a similar composition to the other embodiments according to the disclosure, and also in the form of an individual mirror (for example an imaging mirror in the optical projection system). The mirror facets can be adapted to be individually actuable, without the disclosure be restricted thereto, as indicated by the double-headed arrows P1 and P2 shown in FIG. 9.

As is diagrammatically shown in FIG. 9 the IR radiation which is produced upon heating of the optically effective surfaces 901a, 902a, 903a of the mirror 900 (and which typically is of a wavelength in the range of between 0.8 μm and 1000 μm) is propagated along the access passages 911, 912, 913 and goes to a reservoir 940 by way of which the IR radiation is dissipated. That is effected as shown in FIG. 9 without the presence of cooling fingers engaging into the access passages 911, 912, 913, that is to say solely utilizing the directed emission of the IR radiation along the access passages 911, 912, 913 which act as wave guides for the IR radiation. That accordingly provides for passive cooling at a comparatively low level of structural complication.

In regard to suitable dimensions and sizes by way of example for the access passages 911, 912, 913 (in particular in relation to their lateral extent and the spacing of the end faces, that are towards the respective optical effective surfaces 901a, 902a, 903a of the mirror facets 901, 902, 903, of the access passages 911, 912, 913 relative to the respective optical effective surface 901a, 902a and 903a and in regard to the resulting reflection angles of the IR radiation), attention is directed to the embodiment described hereinbefore with reference to FIGS. 1-8. The efficiency of passive cooling depends on the one hand on the temperature of the reservoir 940 (the lower that temperature, the correspondingly more effective is the passive cooling), and on the other hand on the area which the access passages occupy. If, just by way of example, the proportion of the cross-sectional area of all access passages 911, 912, 913 in relation to the total cross-sectional area of the rear side of the mirror is assumed to be about 50% and if in addition just by way of example heating of the optical effective surface 901 to a temperature of about 40° C. and a reservoir temperature of 0° C. are considered, it is possible to achieve a reduction in temperature via the passive cooling by a value of the order of magnitude of 1-2° C. per hour.

Figure 10:
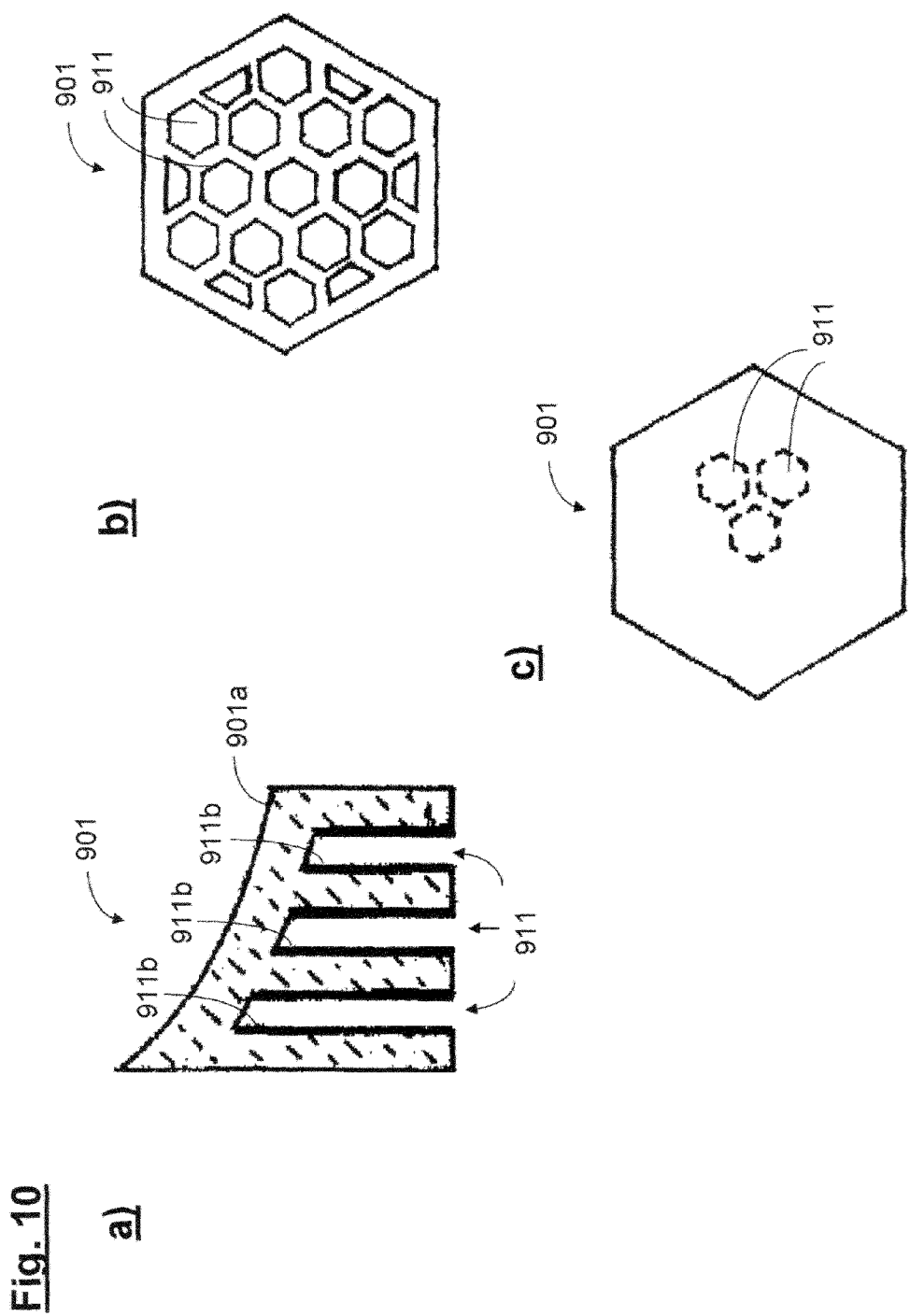

As indicated in FIG. 10*a* the insides or walls of the access passages 911, 912, 913 can be of a reflecting nature, that is to say they can be provided with a reflecting coating or mirroring 911*b*, 912*b*, 913*b*.

In addition the access passages can have different degrees of emissivity in the region of their end faces and their side surfaces or walls (for example, by the end faces of the access passages being blackened and the side surfaces or walls of the access passages being mirrored for example with silver or silver iodide). The end faces of the access passages 911, 912, 913 can thus be designed—for example by a suitable anti-reflection layer for IR radiation (that is to say a strongly absorbent layer which for example has a maximum in the absorption spectrum in the range of 10-20 μm)—with an emissivity of close to 1 while the side surfaces or walls of the access passages can have an emissivity of close to 0. Preferably moreover the mirror rear side (that is to say the surface opposite to the optical effective surface) is mirrored in order to prevent the rear side of the mirror cooling down excessively greatly as a consequence of radiation exchange between the mirror material and the reservoir 940 which is at a lower temperature, and to prevent an unwanted temperature gradient from occurring in the mirror material.

The above-described configuration can contribute to for example the above-described passive cooling of the optical effective surface of the mirror being effected by way of directed emission of heat radiation substantially or predominantly only from the end faces of the access passages (or for the optical effective surface transmitting heat to those end faces), but not or to a considerably lesser degree from the side surfaces or walls of the access passages. In other words, it is possible in that way to ensure that local cooling of the mirror material in the region of the side surfaces or walls does not become excessive or dependent on the material surrounding the respective access passage so that cooling is effected substantially only in the region of the end faces of the access passages and thus only in the proximity of the optical effective surface of the mirror.

As diagrammatically illustrated in FIG. 10*b* a plurality of access passages 911, 912, 913, . . . can be arranged in a two-dimensional array. The access passages 911, 912, 913, . . . can basically be of a cross-section of any geometry (for example round or rectangular). In the FIG. 10*b* embodiment the access passages 911, 912, 913, . . . are of a honeycomb (for example hexagonal) geometry, which is advantageous in regard to mechanical strength or stability as it is still possible to achieve adequate strength for the mirror facets 901, 902, 903 even with the access passages 911, 912, 913, . . . involving a comparatively high proportion in relation to the total volume of the respective mirror facet 901, 902, 903. As indicated in FIG. 10*c* the respective mirror facets 901, 902, 903 in plan view can have a smooth and steadily extending surface or optical effective surface.

A further embodiment of the disclosure is described hereinafter with reference to FIG. 11. The FIG. 11 configuration differs from that shown in FIG. 9 in that, instead of the reservoir 940 for dissipation of the IR radiation, there is an arrangement 945 (preferably once again in the form of an array or matrix) including a heat radiating mechanism in the form of an IR diode laser array. The heat radiation generated by the diode lasers 946 of the arrangement 945, similarly to FIG. 7, passes through the respective access passages 911, 912, 913 and goes to the end face, towards the optical effective surface 701*a*, of the respective access passage 911, 912, 913, wherein it is grazingly reflected as in the above-described embodiments at the respective wall of the access passage 911, 912, 913.

Figure 11:
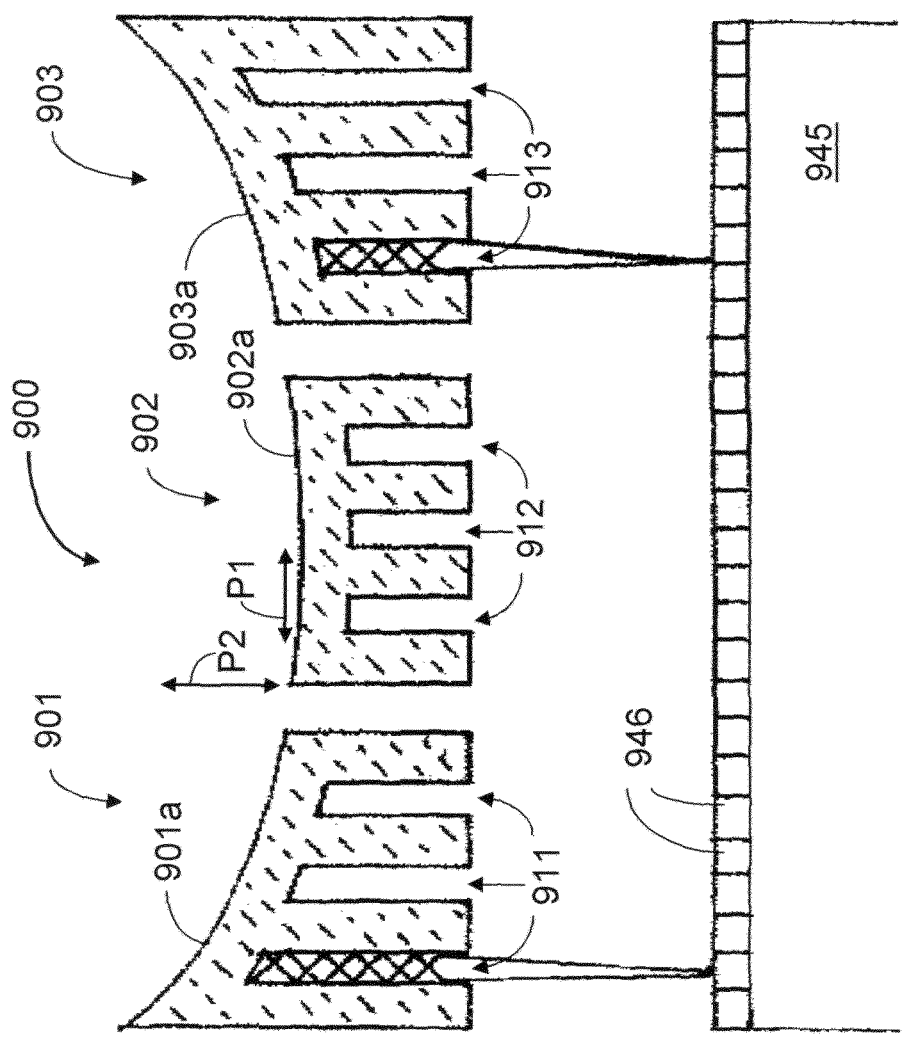

The embodiment of FIG. 11 can be of a substantially similar configuration to the embodiment of FIG. 7, wherein, in particular similarly to FIG. 7, the individual heat radiating mechanisms or IR diode lasers of the arrangement 945 can be selectively actuable in order to provide for a locally targetedly variable input of heat into the respective mirror facet 901, 902, 903, depending on the respective specific factors involved. The FIG. 11 configuration differs from that shown in FIG. 7 however—apart from the application to a facet mirror which is implemented in FIG. 11—in that, as shown in FIG. 11, the arrangement does not involve simultaneous cooling (as is effected in the arrangement in FIG. 7 by the cooler 750), that is to say the arrangement exclusively involves heating of the respective mirror facet 901, 902, 903. In other respects, attention is directed to the embodiments described hereinbefore with reference to FIGS. 1-10 in regard to suitable dimensions and sizes by way of example for the access passages 911, 912, 913 and the resulting reflection angles of the IR radiation.

Further embodiments of actuators relating to the thermal characteristics of a mirror are described hereinafter with reference to FIGS. 12 and 13. In this respect once again, in comparison with FIG. 8, corresponding elements which are comparable with respect to their function are denoted by reference numerals increased by '100'.

The mirror 901 can be an individual mirror (for example an imaging mirror in the optical projection system) or also a facet mirror which is composed of a multiplicity of mirror elements. Furthermore, a plurality of heat radiating mechanisms/access passages can be realized both for a facet mirror being composed of a multiplicity of mirror elements and a single mirror (e.g., a relatively large-sized mirror).

Figure 12:
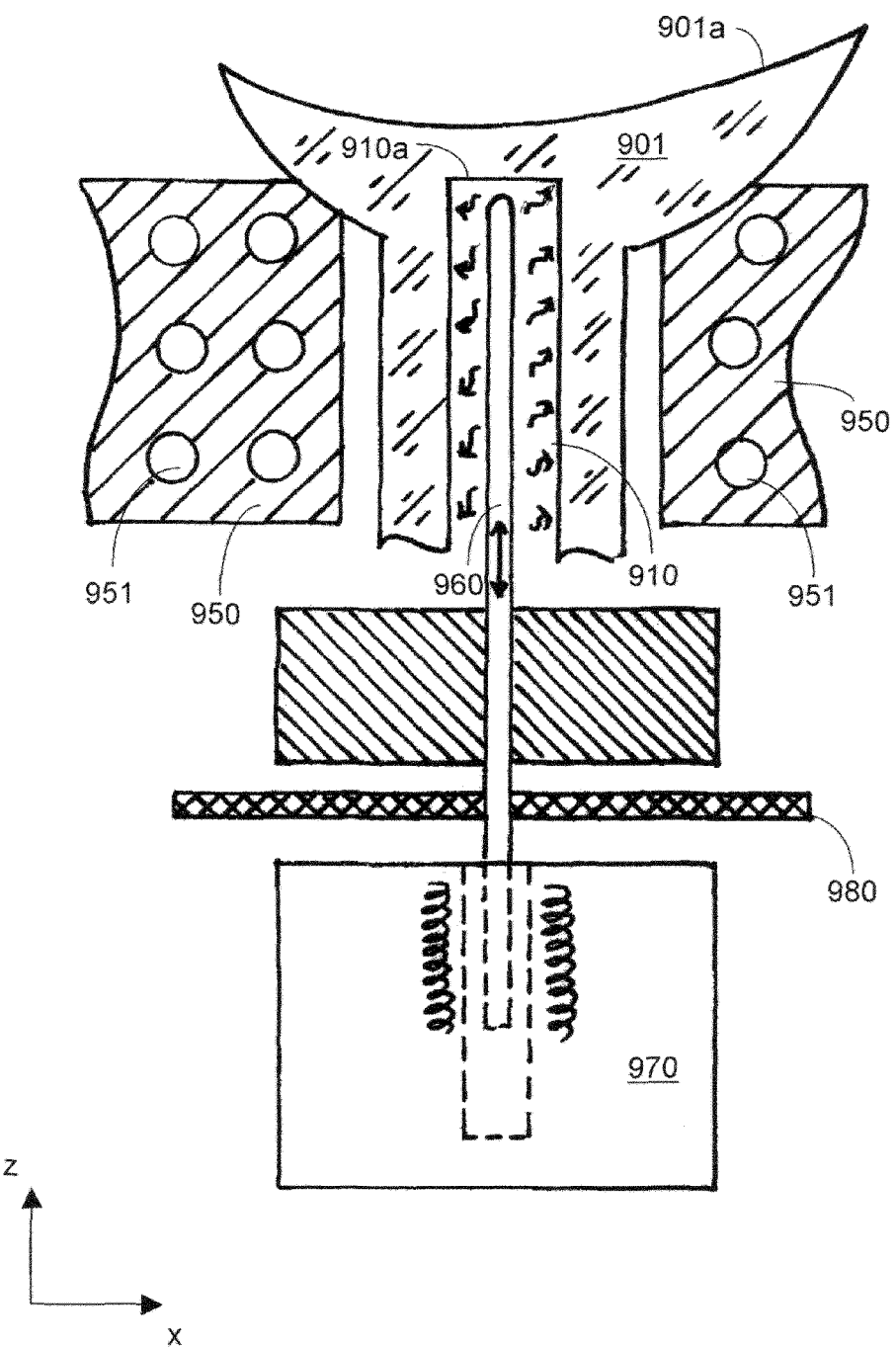

In the FIG. 12 embodiment a heating bar 960 serves as the temperature radiating mechanism, which heating bar is substantially needle-shaped in the illustrated embodiment (and thus takes up only a small amount of space) and is mounted displaceably along an access passage 910 in the mirror 901—along the z-axis in the illustrated co-ordinate system—. By displacement of the heating bar 960 the heated zone at the mirror 901 (in particular in the region of the optical effective surface 901*a* of the mirror 901) and thus the (counter)-deformation achieved finally via the thermal actuation according to the disclosure can be varied. Thus it will be readily apparent that for example placement of the heating bar 960 in the initial portion of the access passage 910, that is remote from the optical effective surface 901*a* of the mirror 910, leads to a temperature gradient occurring in the mirror substrate material, that is different from advance movement thereof into the immediate proximity of the end face 910*a* of the access passage 910. Therefore the displaceability of the heating bar 960 provides a further degree of freedom with respect to thermal actuation of the mirror 901 in relation thereto.

Displacement of the heating bar 960 can be from a position in the immediate proximity of the end face 910*a* of the access passage 910 into the region outside the access passage 910. Typical displacement travels (without the disclosure being restricted thereto) can be of the order of magnitude of 0-30 mm, the value 0 mm corresponding to the beginning of the access passage 910 on the side that is remote from the optical effective surface 910a. In that respect the displacement travel of the heating bar 960 can extend in particular to directly in front of (for example to a distance of 1 mm from) the end portion 910a of the access passage 910, in which case, as in the above-described embodiments, direct mechanical contact in relation to the mirror material is avoided in order not to apply any unwanted mechanical deformation to the mirror 901.

The heating bar 960 is heated up by way of a heating device 970 and acts as a black body radiator, emitting heat in all spatial directions. The heating temperature of the heating bar 960 can be for example in the range of between 60° C. and 350° C. (without the disclosure being restricted thereto). An insulator plate 980 which can be made for example from a suitable ceramic material prevents an unwanted transmission of heat radiation from the heating device 970 to the mirror 901. Besides the advance position of the heating bar 960, the temperature set by the heating device 970 for heating the mirror substrate forms a further parameter for variation in thermal actuation of the mirror 901.

A possible mode of operation of the FIG. 12 arrangement will now be described.

The arrangement of FIG. 12 can be used to influence the imaging characteristics of the mirror 901 by thermal actuation with variable heating of the mirror 901. The measurement technology used in this case may involve a measuring device which directly measures the wave front issuing from the mirror 901. In the case of a mirror 901 in the form of a facet mirror made up of a multiplicity of mirror elements, the resulting wave front is produced by overlapping of the individual contributions of those mirror elements.

With knowledge of the behaviour of the mirror 901 when heating occurs it is then possible to react to changes in the wave front in the field by thermal actuation according to the disclosure.

In practice in that respect, to characterize the behaviour of the arrangement of FIG. 12 when heating is effected for a plurality of (for example two hundred) different heating processes of the mirror substrate—via simulation or by measurement—it is possible in each case to provide for determining the wave front coming from the mirror 901 in order to ascertain the change in the wave front, which is respectively achieved by the heating in question. Those heating processes for the mirror substrate can in that case differ from each other as described hereinbefore with respect to the temperature set by the heating device 970 and/or with respect to the advance position of the heating bar 960. In that case the time dependency of the temperature gradient which occurs in the mirror substrate material or the variation with respect to time of the deformation which ultimately occurs with respect to the mirror 901 can also be taken into consideration and evaluated.

The results obtained in that calibration operation can be stored for example in a suitable table and can be used in operation of the system to ascertain which heating process is the most suitable for a given measured wave front, to produce a suitable counter-deformation.

If now, for a given radiation loading with respect to the mirror 901 in operation of the system, the deformation of the optical effective surface 901a, that occurs in that case in relation to time without thermal actuation, it is then possible to precisely select a given heating or actuation mode, on the basis of the data recorded in the calibration operation, in such a specific fashion as to afford an opposite action or a compensation effect.

The thermal behaviour of the mirror 901 can be characterized in particular by way of FEM simulation operations (FEM='finite element method') in order on the one hand to ascertain which deformations are caused by a given radiation loading on the mirror in operation of the system and which thermal actuation (in the sense of 'counteracting heating') is suitable for compensating for such deformation phenomena. If for example the wave front measurement performed in operation of the system gives an unwanted triple-waviness then the heating suitable for eliminating that triple-waviness can be ascertained from the data previously recorded in the calibration process.

Figure 13:
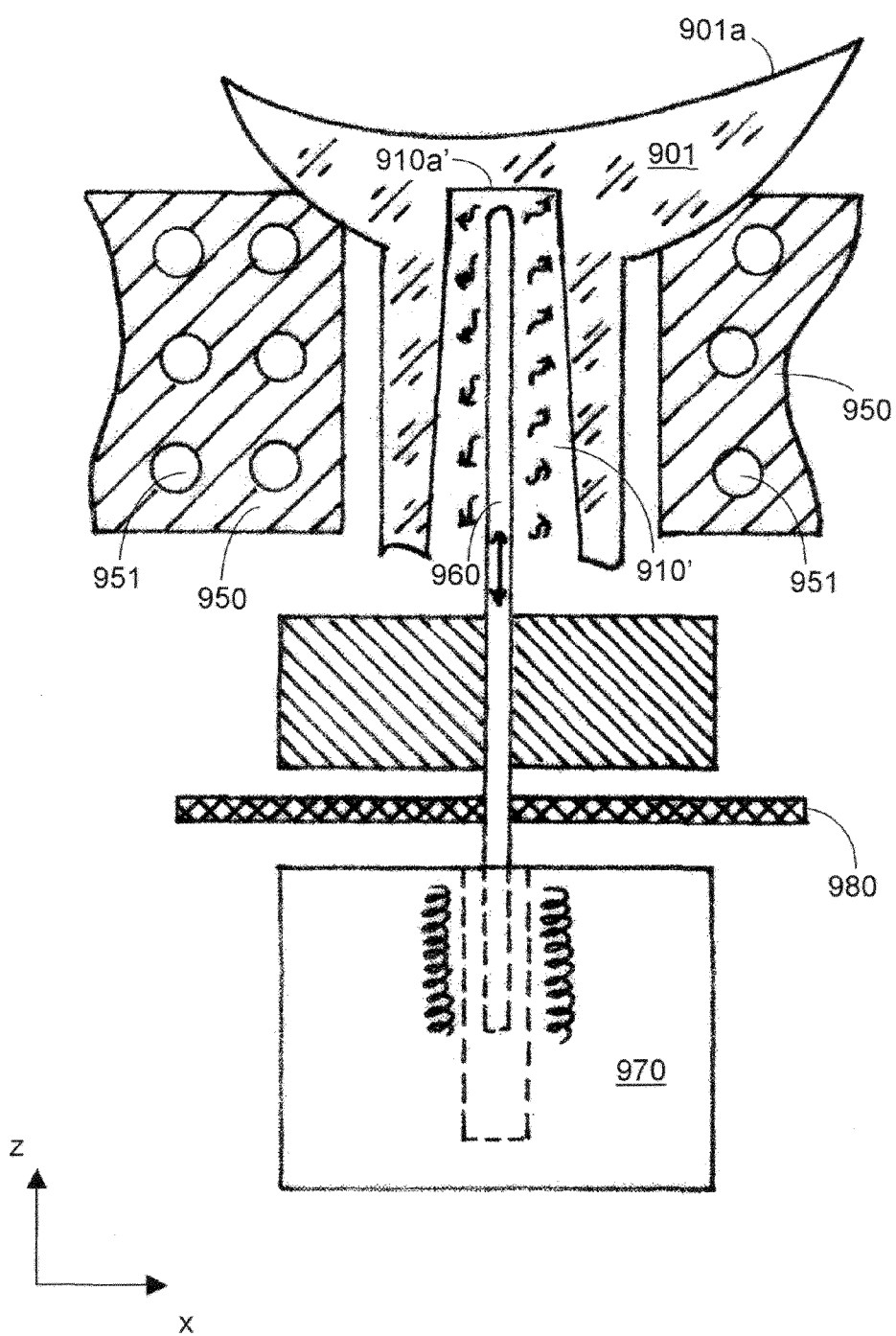

In further embodiments it is also possible to select other geometries for the access passage, for example as diagrammatically illustrated in FIG. 13, a conical geometry of the access passage 910' in order to achieve a different behaviour in relation to time of the temperature gradient in the mirror substrate material or the material expansion that is involved therewith.

In addition individual mirrors of a facet mirror can also be constructed with access passages of differing geometry. By way of example in embodiments of the disclosure some individual mirrors of a facet mirror can each involve an access passage 910' of conical geometry (if for example a desired effect in a given (edge) region of the facet mirror can be better achieved when using a conical access passage 910' than when using a cylindrical access passage 910), and others with an access passage of cylindrical geometry. Other geometries, such as for example a step-wise variation of the diameter along the respective access passage, are also possible. Other geometries, such as for example a step-wise variation of the diameter along the respective access passage, are also possible.

Even if the disclosure has been described by reference to specific embodiments numerous variations and alternative embodiments will be apparent to the man skilled in the art, for example by combination and/or exchange of features of individual embodiments.

Accordingly it will be appreciated by the man skilled in the art that such variations and alternative embodiments are also embraced by the present disclosure and the scope of the disclosure is limited only in the sense of the accompanying claims and equivalents thereof.

What is claimed is:

1. An arrangement, comprising:
   a mirror having an optical effective surface, a second surface different from the optical effective surface, and an access passage extending from the second surface in a direction of the optical effective surface, the access passage having sidewalls;
   wherein the arrangement is configured so that:
   a measurement of a temperature of the mirror and/or a thermal actuation of the mirror is achievable based on electromagnetic radiation which has undergone multiple reflections with the sidewalls of the access passage;
   all the electromagnetic radiation that contributes to the mirror temperature measurement and/or the thermal actuation of the mirror has a reflection angle with the sidewalls of the access passage that is not greater than 20°; and
   the electromagnetic radiation is coupleable via the access passage into a region in immediate proximity of the optical effective surface.

2. The arrangement of claim 1, wherein a region of the mirror is opaque to the electromagnetic radiation.

3. The arrangement of claim 1, wherein the electromagnetic radiation has a wavelength of at least 2.5 µm.

4. The arrangement of claim 1, wherein the second surface is opposite to the optical effective surface.

5. The arrangement of claim 1, further comprising a tube projecting into the access passage.

6. The arrangement of claim 1, wherein the access passage comprises a reflecting coating.

7. The arrangement of claim 1, wherein an end face of the access passage has a first emissivity, and a side surface of the access passage has a second emissivity which is different from the first emissivity.

8. The arrangement of claim 1, further comprising a sensor configured to detect the electromagnetic radiation.

9. The arrangement of claim 8, wherein the sensor comprises a thermopile sensor.

10. The arrangement of claim 1, further comprising a regulating device by which the mirror is heatable to a constant temperature depending on a mirror temperature measurement.

11. The arrangement of claim 1, wherein the mirror comprises a plurality of access passages.

12. The arrangement of claim 1, further comprising a heat radiating mechanism configured to produce the electromagnetic radiation.

13. The arrangement of claim 12, further comprising a manipulator configured to vary a position of the heat radiating mechanism along the access passage.

14. The arrangement of claim 12, wherein the heat radiating mechanism comprises a heating bar.

15. The arrangement of claim 12, wherein the heat radiating mechanism is laterally actuable with respect to the direction of the access passage.

16. The arrangement of claim 12, wherein the heat radiating mechanism is connected to a regulatable heating device.

17. The arrangement of claim 12, comprising a plurality of selectively actuable heat radiating mechanisms arranged as an array.

18. The arrangement of claim 1, wherein the access passage has a geometry differing from a cylindrical geometry.

19. The arrangement of claim 1, wherein the mirror comprises at least two access passages of differing geometry.

20. The arrangement of claim 1, further comprising a cooler configured to dissipate heat to the environment.

21. The arrangement of claim 1, wherein the mirror comprises a multiplicity of mirror facets.

22. A method of measuring a temperature of a mirror in a microlithographic projection exposure apparatus, the mirror having an optical effective surface, a second surface, and an access passage extending from the second surface in a direction of the optical effective surface, the method comprising:
reflecting electromagnetic radiation a plurality of times with sidewalls of the access passage as the electromagnetic radiation propagates along the access passage; and
measuring the reflected electromagnetic radiation to determine the temperature of the mirror,
wherein:
all the electromagnetic radiation that contributes to measuring the mirror temperature has a reflection angle with the sidewalls of the access passage that is not greater than 20°; and
the electromagnetic radiation is coupled by way of the access passage into a region in immediate proximity of the optical effective surface.

23. The mirror of claim 22, further comprising using an arrangement of selectively actuated heat radiating mechanisms to produce the electromagnetic radiation.

24. The mirror of claim 22, further comprising using a cooler to maintain a constant heat discharge flow.

25. A method of actuating a mirror in a microlithographic projection exposure apparatus, the mirror having an optical effective surface, a second surface, and an access passage extending from the second surface in a direction of the optical effective surface, the method comprising:
reflecting electromagnetic radiation a plurality of times with sidewalls of the access passage as the electromagnetic radiation propagates along the access passage to transfer some of the energy of the electromagnetic radiation to the mirror to actuate the mirror,
wherein:
all the electromagnetic radiation that contributes to actuating the mirror has a reflection angle with the sidewalls of the access passage that is not greater than 20°; and
the electromagnetic radiation is coupled by way of the access passage into a region in immediate proximity of the optical effective surface.

* * * * *

UNITED STATES PATENT AND TRADEMARK OFFICE
CERTIFICATE OF CORRECTION

| | | |
|---|---|---|
| PATENT NO. | : 9,207,541 B2 | Page 1 of 1 |
| APPLICATION NO. | : 13/784979 | |
| DATED | : December 8, 2015 | |
| INVENTOR(S) | : Markus Hauf et al. | |

It is certified that error appears in the above-identified patent and that said Letters Patent is hereby corrected as shown below:

In the specification,

Col. 1, line 24, delete "micro lithographic" and insert --microlithographic--.

Col. 1, lines 28-29, delete "micro structured" and insert --microstructured--.

Col. 2, line 24, delete "micro lithographic" and insert --microlithographic--.

Col. 5, line 27, delete "micro lithographic" and insert --microlithographic--.

Col. 9, line 19, delete "micro lithographic" and insert --microlithographic--.

Signed and Sealed this
Twenty-sixth Day of April, 2016

Michelle K. Lee
*Director of the United States Patent and Trademark Office*